United States Patent
Kubara et al.

(10) Patent No.: US 6,395,583 B1
(45) Date of Patent: May 28, 2002

(54) SEMICONDUCTOR DEVICE WITH A COATING OF PB-FREE SN-BASE SOLDER AND MANUFACTURING METHOD THEREFOR

(75) Inventors: Takashi Kubara, Chikushino; Matsuo Masuda, Oita-ken; Tsuyoshi Tokiwa, Nakatsu; Hisahiro Tanaka, Fukuoka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/548,351

(22) Filed: Apr. 12, 2000

(30) Foreign Application Priority Data

Apr. 22, 1999 (JP) .......................................... 11-114469

(51) Int. Cl.[7] ........................ H01L 21/44; H01L 23/495
(52) U.S. Cl. ....................... 438/123; 257/666; 257/677; 438/106
(58) Field of Search ................................ 438/123, 106; 257/666, 677

(56) References Cited

U.S. PATENT DOCUMENTS

| | | | | |
|---|---|---|---|---|
| 5,986,335 A | * | 11/1999 | Amagai | 257/668 |
| 6,017,777 A | * | 1/2000 | Kim et al. | 438/123 |
| 6,066,887 A | * | 5/2000 | Hong et al. | 257/668 |
| 6,087,714 A | * | 7/2000 | Kubara et al. | 257/666 |

FOREIGN PATENT DOCUMENTS

JP 10102283 4/1998

* cited by examiner

Primary Examiner—Caridad Everhart
Assistant Examiner—Belur V Keshavan
(74) Attorney, Agent, or Firm—Stevens, Davis, Miller & Mosher, LLP

(57) ABSTRACT

A lead frame made from Ni, a Ni alloy, Cu, a Cu alloy, Fe or an Fe alloy, comprising an inner lead part with a surface treatment layer of Ag or a Ag-containing alloy and an outer lead part with a surface treatment layer of an alloy containing Ag and Sn, wherein the latter surface treatment layer has a brightness of not less than 0.6 and Sn has the body-centered tetragonal lattice with the crystal orientation indices of from 1.5 to 5 at the (220) plane, not more than 0.9 at the (211) plane and not less than 0.5 at the (200) plane. The surface treatment layer is plated with utilization of a plating solution which contains one or more selected from alkane sulfonic acid, alkanol sulfonic acid and sulfamine acid as the acid component, one or more of tin methane-sulfonate and SnO as a tin salt, and one or more slected from silver methane-sulfonate, $Ag_2O$ and AgO as a silver salt. The outer lead part may be subjected to a preliminary etching treatment with utilization of a treatment agent of one or more selected from chloric acid, nitric acid and sulfic acid prior to forming the surface treatment layer. The formed surface treatment layer may be treated by a treating agent containing sodium triphosphate.

13 Claims, 3 Drawing Sheets

SEMICONDUCTOR DEVICE WITH A COATING OF PB-FREE SN-BASE SOLDER AND MANUFACTURING METHOD THEREFOR

BACKGROUND OF THE INVENTION

1. Field of the Invention

The present invention relates to a lead frame which is made of Ni, an Ni alloy, Cu, a Cu alloy, Fe or an Fe alloy and used for ICs, etc., especially, to the semiconductor device with the lead frame for electronic parts, which does not comprise Pb being one of harmful contaminants and pollutants for environment, and a manufacturing method therefor.

2. Description of the Prior Art

FIGS. 3 and 4 are a plane view and a sectional view of a conventional lead frame, respectively. In case of the conventional lead frame, inner lead parts 2, to which wires are bonded, have been plated with Ag, and outer lead parts 1 have been subjected to a surface treatment with a coating material containing Pb and Sn.

In recent years, the environmental problems focus the spotlight of attention so that, regarding also components of IC packages, materials which do not contain any detrimental contaminants and pollutants for environment have been examined and looked for.

Among substances which are contained in lead frames of electronic parts, lead is an especially harmful pollutant to the environment. Lead in the lead frames, which are left in the environment, will dissolve into the environment to adversely affect on health of human bodies. Thus, the electronic industry tries to develop a Pb-free solder, a Pb-free paste solder and so on. But, there is no new Pb-free solder at present, which has the same or better characteristics than conventional Pb-containing solders, in the stage of actual application.

Regarding the lead frame of electronic parts, various efforts have been made for developing a new one. Recently, in order to avoid to use Pb-containing solders for lead frames, there has been proposed and practically used a lead frame whose surface is overall plated with palladium (Pd). But, such a palladium-nickel lead frame has a problem that, when the lead frame is heated up in the die-bonding process (or die-attach process) or the wire-bonding process, the Pb-free solder is deteriorated in wettability to the plated palladium resulting in low reliability of solder joints. Therefore, recently, it has been proposed a palladium-nickel lead frame plated with gold (Au) as a protective film. However, because only a limited number of countries can supply palladium, the price thereof is liable to rise due to its short supply so that there arises a cost problem. In the case of providing the protective film of gold on the palladium plating, the cost problem become further big.

Further, regarding the palladium-nickel frame, since burrs are liable to be generated in the resin molding process when assembling ICs, an additional process of removing the burrs is required resulting in an increase of manufacturing cost.

On the other hand, in the case of a lead frame whose overall surface is plated with palladium, since a large potential difference is generated between palladium and the base metal of the lead frame, even if an intermediate layer of Ni or a Pd—Ni alloy is provided between the lead frame made of Ni, a Ni alloy, Fe or an Fe alloy, for example, and the palladium plating, there arises a lack of reliability with regard to a corrosion problem. Thus, the palladium plating can be applied to only a lead frame made of Cu or a Cu alloy.

There has been conducted another development of lead frames than those with utilization of palladium, which provides a Pb-free solder plating which includes indium (In), bismuth (Bi), zinc (Zn), etc. as an alternative to lead in the usual Pb—Sn system solder. With regard to a solder alloy or a paste solder for the reflow process, there have been proposed alloys each of which includes two or more alloying elements as well as tin (Sn), namely each of which consists of three or four alloying elements including Sn. But, since it is difficult to control the plating alloy composition consisting of three or four alloying elements, which is deposited from the plating solution, binary alloys consisting of Sn and another alloying element have been mainly tried to develop.

However, an In—Sn alloy is inappropriate for practical use because indium is expensive.

With regard to a Bi—Sn alloy, while it is possible to make its melting point low, it is inappropriate for lead frames, which are subjected to a bending process during manufacturing, because of bad formability due to becoming hard and brittle when lowering the melting point thereof. Further, the Bi—Sn alloy has a defect that the lift off phenomenon occurs, in which ICs float on the solder in the surface-mounting process, because it has low bonding strength and low thermal fatigue strength due to low wettability.

A Zn—Sn alloy has the melting point close to that of the conventional Pb—Sn solder alloy and an advantage that zinc is cheap. However, the Zn—Sn alloy has a defect that, because zinc is liable to be oxidized in air, it oxidizes when receiving thermal hysteresis in the assembling process so that it is deteriorated in wettability.

Recently, on the other hand, there has been proposed an Ag—Sn alloy as the most hopeful Pb-free solder and developed plating solutions therefor. However, there are barriers for practical use thereof since it have some problems of appearance, occurrence of cracks when bending, a tarnish due to thermal hysteresis, deterioration of wettability due to thermal hysteresis and so on.

SUMMARY OF THE INVENTION

An object of the invention is to solve the above mentioned problems of the known solders and provide a semiconductor device and a manufacturing method thereof wherein the semiconductor device comprises a surface treatment layer as a post-plating which includes Ag and Sn and which is provided on a low cost lead frame for electronic parts mounted on the semiconductor device, and wherein the plating does not comprise lead (Pb) which is one of harmful contaminants and pollutants for environment, and has good soldering wettability and good bonding strength property.

Under the object, there is provided a lead frame made from Ni, a Ni alloy, Cu, a Cu alloy, Fe or an Fe alloy, which comprises an inner lead part with a surface treatment layer of Ag or a Ag-containing alloy and an outer lead part with a surface treatment layer of an alloy containing Ag and Sn, wherein the surface treatment layer has a brightness of not less than 0.6 and Sn has the body-centered tetragonal lattice with the crystal orientation indices of from 1.5 to 5 at the (220) plane, not more than 0.9 at the (211) plane and not less than 0.5 at the (200) plane.

In order to form the surface treatment layer containing Ag and Sn, which has a brightness of not less than 0.6 and in which Sn has the body-centered tetragonal lattice with the crystal orientation indices of from 1.5 to 5 at the (220) plane, not more than 0.9 at the (211) plane and not less than 0.5 at the (200) plane, a specific plating solution is used, which contains, at least, one or more selected from alkane sulfonic acid, alkanol sulfonic acid and sulfamine acid as the acid component, one or more of tin methane-sulfonate and SnO as a tin salt, and one or more selected from silver methane-sulfonate, $Ag_2O$ and AgO as a silver salt.

In order to improve the bonding property between the base of the outer lead part and the surface treatment layer, the outer lead part is preliminarily treated prior to forming the surface treatment layer by a treating agent of one or more selected from hydrochloric acid, nitric acid and sulfonic acid.

Further, in order to improve surface conditions and soldering wettability of the outer lead part, the formed surface treatment layer is treated by a treating agent containing sodium triphosphate.

The surface treatment layer may have a thickness of preferably 3 to 15 µm.

The alloy composing the surface treatment layer may comprise 1 to 8 wt % Ag, thereby the defects of the known art can be totally improved so that there can be provided a low cost lead frame for electronic parts and a manufacturing method thereof, the lead frame comprising no lead (Pb), which is one of harmful contaminants and pollutants for environment, and having good soldering wettability and good bonding strength property.

DESCRIPTION OF THE PREFERRED EMBODIMENTS

Figure 1:
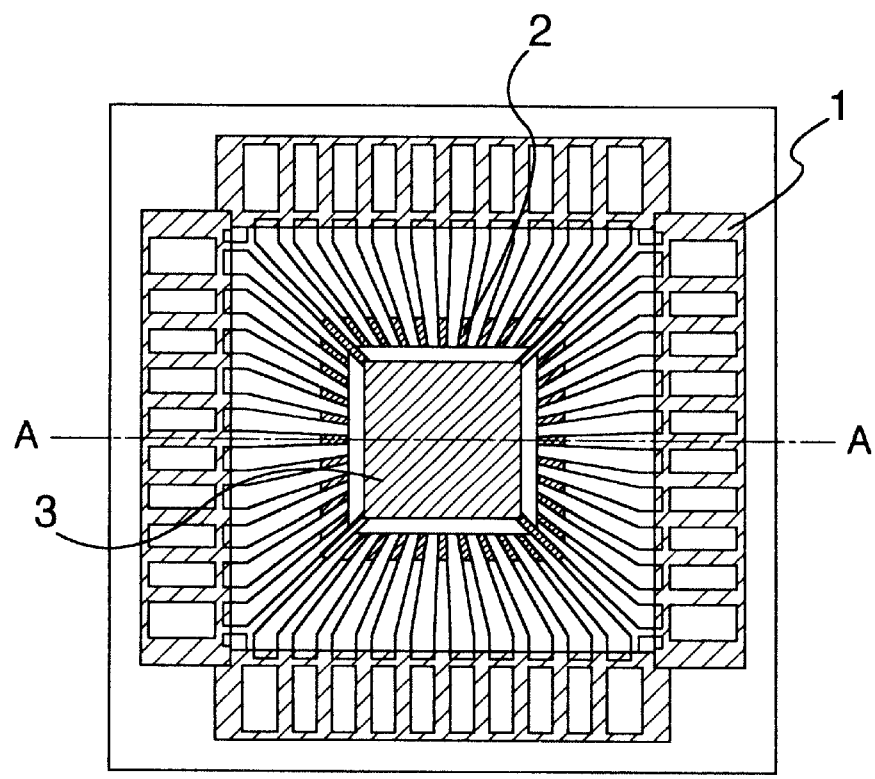
FIG. 1 is a plane view of a lead frame of one embodiment according to the invention.

A plating used in the invention, which is not harmful to the environment, is made of the alloy which contains Ag and Sn, and which has a brightness of not less than 0.6 and in which Sn has the body-centered tetragonal lattice with the crystal orientation indices of from 1.5 to 5 at the (220) plane, not more than 0.9 at the (211) plane and not less than 0.5 at the (200) plane. With regard to an alloy plating of Ag and Sn, in the case where the crystal orientation index at the (220) plane is not less than 5, since the crystal orientation index at the (211) plane is not more than 0.9, it is possible to form a film comprising Sn of a body-centered tetragonal lattice having the crystal orientation index of not less than 0.5 at the (200) plane. But, because the brightness of the film is not more than 0.6, when the outer lead part is bent, cracking is liable to occur in the plating film thereon and the plating film is liable to be oxidized to tarnish by heat during assembling an IC so that soldering wettability is adversely affected.

Although the present inventors are not confident on details of mechanism of the above phenomenon, it can be said as follows:

1. Occurrence of cracks is correlative to the slip plane of crystals. The (220) plane is difficult to suffer cracking since it is of a slip plane having the smallest critical shearing stress so that cracking occurs hardly.
2. Although, reflection from the (111) plane can not be observed, β-Sn is of the body-centered tetragonal lattice, and in appearance the (111) plane has the largest density of lattice points per unit area, thus β-Sn is hardly oxidized. Therefore, in the case where the (111) plane is of the priority orientation, there will not occur the problems of tarnish due to oxidation and deterioration of soldering wettability.

From the above consideration, the film alloy used in the present invention is decided to have the body-centered tetragonal lattice structure with the crystal orientation indices of from 1.5 to 5 at the (220) plane, not more than 0.9 at the (211) plane and not less than 0.5 at the (200) plane, wherein the crystal orientation is fully close to the both orientations of the (111) plane and the (220) plane which has the smallest critical shearing stress. Thus, we have found that the above disadvantage can be avoided by using the above mentioned Sn—Ag film having a brightness of not less than 0.6 and Sn has the body-centered tetragonal lattice with the crystal orientation indices of from 1.5 to 5 at the (220) plane, not more than 0.9 at the (211) plane and not less than 0.5 at the (200) plane, which exhibits no crack, no tarnish after heating and good soldering wettability. Further, the Sn—Ag has no problem in the supply system and the cost not like as palladium, and also in properties as compared with Sn—Bi, Sn—Zn and Sn—In systems. Although the Sn—Ag system has the melting point and eutectic temperature (221° C.) than those of the conventional Sn—Pb system, it has substantially the same solder joint strength and soldering wettability as those of the conventional solder containing/lead. This is because the plating film on the outer lead of the lead frame does not completely melt to wet during soldering and the solder joint strength can be obtained by reaction between the plating film and a paste solder or a solder for reflow.

Figure 2:
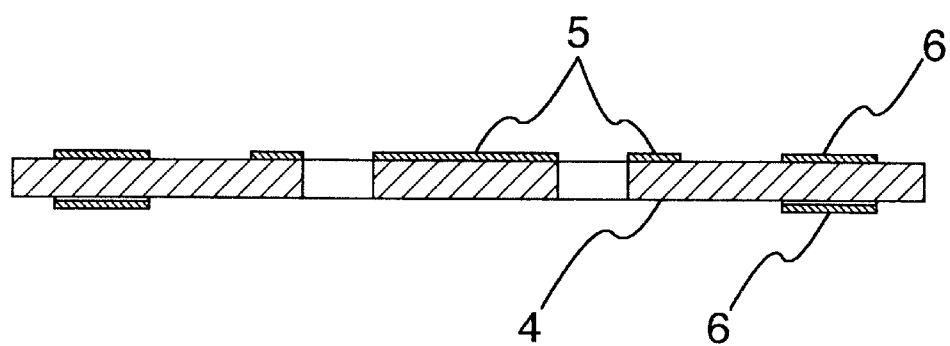
FIG. 2 is a sectional view of the lead frame taken along line A—A in FIG. 1.
Figure 3:
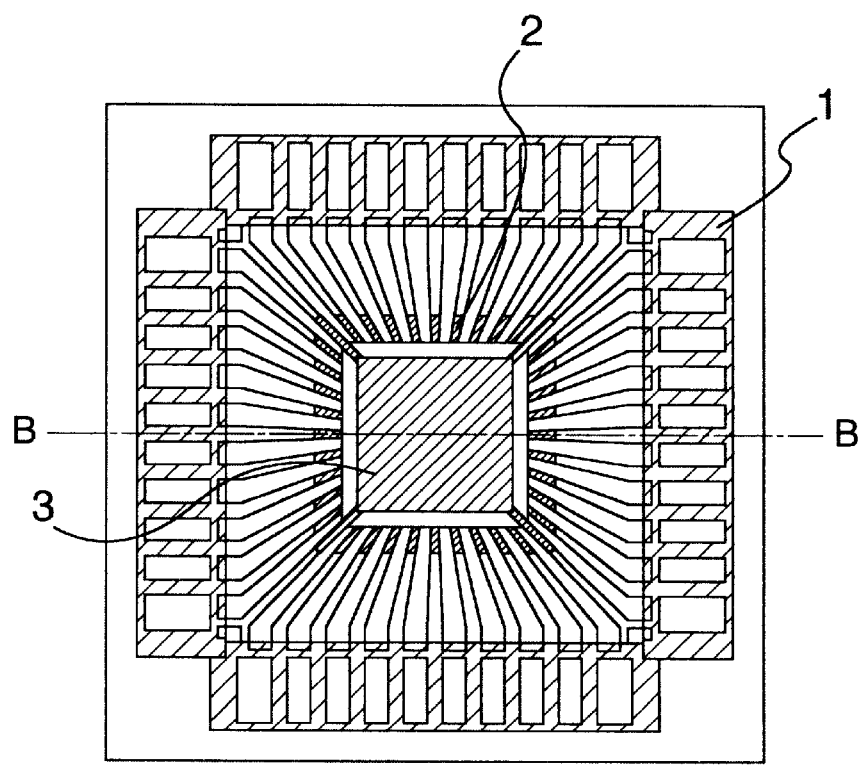
FIG. 3 is a plane view of a conventional lead frame.
Figure 4:
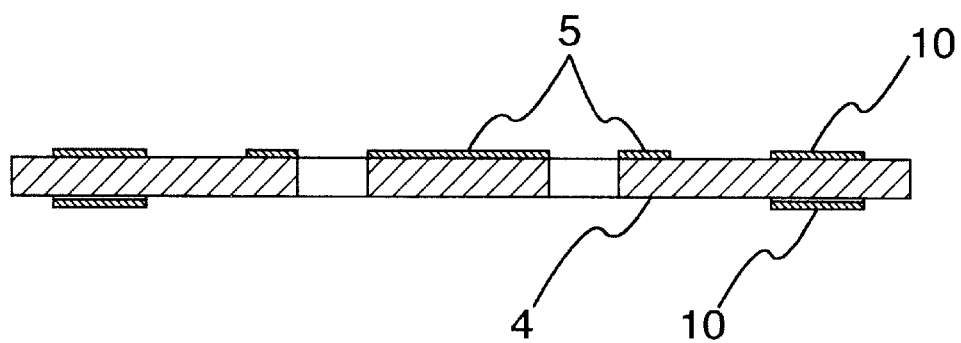
FIG. 4 is a sectional view of the lead frame taken along line B—B in FIG. 3.

Referring to FIGS. 1 and 2, respective inner lead parts 2 of the lead frame is provided with a surface treatment layer 5 made of Ag or a Ag-containing alloy. Respective outer lead parts 1 is provided with a surface treatment layer 6 which is made of an alloy containing Ag and Sn, which has a brightness of not less than 0.6, Sn having the body-centered tetragonal lattice with the crystal orientation indices of from 1.5 to 5 at the (220) plane, not more than 0.9 at the (211) plane and not less than 0.5 at the (200) plane. The both surface treatment layers 5 and 6 may be separated or connected with each other. The surface treatment layer 5 may be formed only on the inner lead part 2, reach a pad 3 or cover the overall surface of the pad 3.

According to one embodiment of the invention, the both surface treatment layers 5 and 6 are formed by plating under the condition of a plating solution containing 1 to 4 g/l of a sulfuric compound, a thioamido compound, a thiol compound and chiosulfate as a stabilizer for Ag and the current density of 60 A/dm².

In the case of a comparative specimen, the surface treatment layers were formed by plating under the condition of a plating solution containing not less than 4 g/l of a stabilizer for Ag and the current density of 20 to 25 A/dm².

However, it is possible to realize plating conditions in order to obtain the crystal orientation of the surface treatment layer according to the present invention by adjusting compositions of plating solution, types of additive material, temperature of the plating solution, conditions of agitation, current density, wave forms of corrent, etc. The surface treatment layer can be obtained by the physical evaporation plating process, the spattering process, the CVD process, etc.

Herein the brightness of the surface treatment layers was measured by a brightness gauge of MODEL 144 (gray scale) produced by the company of GAM.

The principle of measuring brightness is as follows. When a beam of light is incident on the surface of a substance in a right angle, a reflection rate will be different depending upon surface conditions thereof. A brightness degree can be determined by measuring the difference of detected values of the reflection rate with utilization of a detector which is positioned at a predetermined angle of 45° to the object surface. The brigntness density of "D" is shown by the equation of D=log (1/R), where R is a reflection rate at an angle direction of 45°.

The brigntness density is smaller in the case of a rough object surface and larger in the case of a smooth object surface. The crystal orientation index was determined by the method of Willson et al. (namely, K. S. Willson and J. A. Rogers) (which can be seen in AES. Tech. Proceeding, 92(1964)). According to the method, provided that "Ii" is the diffraction intensity of respective surface indices (hi, ki, li) determined by the X-ray diffraction, the ratio of the diffraction intensity Ij (hj, kj, lj) of a diffraction plane to be determined a sum ΣIi (hi, ki, li) of the diffraction intensity of surface indices can be expressed by the equation I×F=Ij (hj, kj, lj)/ΣIi (hi, ki, li).

Next, calculating the ratio (I×F×R) of the sum of diffraction intensities of crystal lattice planes to that of the object crystal lattice plane to be determined, the crystal orientation index is I×F/I×F×R. If the crystal orientation index is not less than "1", the object crystal lattice plane has a high orientation degree. Thus, it is determined that crystals of the plating film of the surface treatment layer are oriented with priority regarding the crystal orientation index.

INVENTION EXAMPLE 1

Semiconductor lead frame bases are made from Cu or a Cu alloy, which includes a Sn—P bronze alloy and an alloy 194, or an Fe—Ni alloy which is called "42 material" containing about 42 wt % Ni. In this example 1, the lead frame base is made of 42 material. First, a thin plate of 42 material is formed to have a lead frame form.

There are two ways for forming the lead frame. A first way comprises applying a photo-resist to the surface of the thin plate, irradiating a light to the photo-resist film for patterning, developing the photo-resist film to partially leave it as a positive pattern of the lead frame, and etching the photo-resist film with an etching solution such as ferric chloride ($FeCl_2$), copper chloride ($CuCl_2$), etc. A second way comprises preparing a forming die and blanking the thin plate by a press to provide a lead frame form. In the present invention, the etching method and the press method are both available.

In this example 1, a lead frame is made as follows:

a. a thin plate of 42 material is formed by pressing to a lead frame form, b. the formed plate is cleaned by washing, c. the cleaned plate is optionally subjected to a heat treatment process to relieve residual stress therein, and d. the blank lead frame is subjected to the following plating process.

Plating Process a. the blank lead frame was subjected to a cleaning process in order to remove fatty matters being adhered on the blank lead frame during the press process and the heat treatment process, the cleaning process comprising a dipping method with utilization of an alkaline degreasing agent, for example, and/or an electrical method, b. the degreased blank lead frame was plated with a preliminary plating of Cu having a thickness of 0.2 μm, wherein the plating was carried out using a copper cyanide solution, c. inner lead parts 2 were plated with Ag by a local plating process, wherein the plating was carried out using a silver cyanide solution, d. in order to improve adhesion property of a Sn—Ag/ layer to the base of the blank lead frame, the lead frame was subjected to a preliminary treating with utilization of a treatment agent of one or more selected from chloric acid, nitric acid and sulfic acid prior to forming a surface treatment layer 6 which contains Ag and Sn, which has a brightness of not less than 0.6, and in which Sn has the body-centered tetragonal lattice with the crystal orientation indices of from 1.5 to 5 at the (220) plane, not more than 0.9 at the (211) plane and not less than 0.5 at the (200) plane, wherein the lead frame was treated at 30° C. of temperature with the treatment agent containing chloric acid for 15 seconds to remove impurities on the surface and etch the surface so that the adhesion property of the Sn—Ag/layer was improved for an anchoring effect, and e. after the preliminary treating, outer lead parts 1 were plated with a Sn—Ag alloy (which consists essentially of Sn and Ag) under the current density of 60 A/$dm^2$ by a local plating process.

The plating solution for the Sn—Ag plating may contain one or more selected from alkane sulfonic acid, alkanol sulfonic acid and sulfamine acid as the acid component, one or more of tin methane-sulfonate and SnO as a tin salt, and one or more slected from silver methane-sulfonate, $Ag_2O$ and Ago as a silver salt. In order to obtain the surface treatment layer 6 which contains Ag and Sn, which has a brightness of not less than 0.6, and in which Sn has the body-centered tetragonal lattice with the crystal orientation indices of from 1.5 to 5 at the (220) plane, not more than 0.9 at the (211) plane and not less than 0.5 at the (200) plane, the plating solution most preferably contains 50 to 200 g/l of acid, 20 to 60 g/l of Sn, and 0.5 to 3 g/l of Ag.

In this example 1, the plating solution contained 150 g/l of methane-sulfonate, 40 g/l of metal Sn as SnO and 1.5 g/l of metal Ag as $Ag_2O$.

Regarding the additives in the plating solution, it is possible to use at least the following substances:

a. the stabilizer for Ag: one ore more of a sulfuric compound, a thioamido compound, a thiol compound and thiosulfate;

b. the stabilizer for Sn: one or more of carboxylic acid, sulfamine acid, pyrophosphoric acid and chelating agent; and c. the controller for crystal: one or more of aromatic sulfonate, aliphatic sulfonate, a hidatoyne compound, a cysteine compound, aromatic organic amine, aliphatic aldehyde, aromatic aldehyde, a nonionic surface active agent, an amphoteric ion surface active agent and an anion surface active agent.

In the case of example 1, the following additives were used: 3 g/l of 2-amino benzene thiol, 5 g/l of naphthalene sulfonic acid mono-polyethylene glycol ether and 80 g/l of bisphenol A dispolyethylene glycol ether. It should be noted that 8 g/l or more of additive 2-amino benzene thiol as the stabilizer for Ag makes the crystal orientation unstable and 1 g/l or less thereof makes Ag unstable.

The plating was carried out by a jet flow method with utilization of a sparger under the conditions of a flow rate of 400 l/min. and 25° C. of plating temperature.

While the anode electrode is unsoluble and may be a material comprising one or more of Pt, Ir, Ta, Rh, Ru and an oxide thereof, in this example 1, the unsoluble electrode was a Ti base with a coating of a mixture of iridium oxide and tantalum oxide. If a soluble electrode made of a solder alloy is used, since it must be frequently replaced while stopping the process line, the productibility will be extremely decreased.

The thickness of plating films may be 3 to 15 μm. If the thickness is less than 3 μm, soldering wettability is deteriorated by an adverse affect due to the base material. If the thickness is more than 15 μm, there will occur shortcomings such as a leak of resin from molds during the sealing process of resin molding.

In example 1, the plating film was of a Sn—Ag alloy and has 8 μm of thickness. An amount rate of Ag in the Sn—Ag alloy may be 1 to 8 wt %. If the Ag amount exceeds 8 wt %, there will occur the electro-migration of Ag during operation of ICs. In example 1, the Ag amount rate was 2 wt %.

After the Sn—Ag plating, the Cu underlayer in exposed surface areas, which had not been coated with the Ag plating and the Sn—Ag plating, was removed. Further, in order to remove unintentionally plated Ag layers on the sides of the lead, Ag on the lead frame surface was electrically removed.

Subsequently, the surface treatment layer 6 with a brightness of not less than 0.6, which comprises Ag and Sn, and which is formed on the outer lead part 1, was subjected to an etching process with utilization of a treatment agent including sodium triphosphate in order to improve soldering wettability under the following conditions, wherein Sn has the body-centered tetragonal lattice with the crystal orientation indices of from 1.5 to 5 at the (220) plane, not more than 0.9 at the (211) plane and not less than 0.5 at the (200) plane: a concentration of 120 g/l sodium triphosphate of the treatment liquid, 60° C. of the liquid temperature, and 30 seconds of the dipping duration time.

Finally, the lead frame was dipped in the anti-tarnish liquid followed by washing with water and subsequent drying.

The thus processed lead frame was examined by means of an X-ray diffractometer with regard to the crystal orientation of the Sn—Ag plating layer. As a result, it was confirmed that the Sn—Ag plating layer had a brightness of 1.16 and comprised Sn having the body-centered tetragonal lattice with the crystal orientation indices of from 2.93 at the (220) plane, 0.14 at the (211) plane and 1.01 at the (200) plane.

Soldering wettability was also examined by means of a testing device for soldering wettability (the solder checker of SWET 100 made by Tanchin) under the following conditions: the solder of Sn—Pb (H63S), 230° C. of solder bath-temperature, and the flux of R-100-40 (non-halogen). A bending test was also carried out in order to observe exfoliation of the plating film, in which the outer lead part 1 was bent by an angle of 90. The results were satisfactory as shown in Table 1 with regard to the zero cross times at initial and after holding at 175° C. for 24 hours, and an appearance.

TABLE 1

|  | Invention Example 1 | Invention Example 2 | Comparative Example 1 | Comparative Example 2 |
|---|---|---|---|---|
| Brightness | 1.16 | 0.74 | 0.45 | 0.5 |
| Crystal index (200) | 1.01 | 0.89 | 0.11 | 0.27 |
| (220) | 2.93 | 1.69 | 6.38 | 6.07 |
| (211) | 0.14 | 0 | 0.12 | 0.06 |
| Initial Zero Cross Time | 0.35 sec. | 0.8 sec. | 0.9 sec. | 1.2 sec. |
| Zero Cross Time after holding at 175° | 0.45 sec. | 0.9 sec. | 2 sec. | 5 sec. |
| Cracks after Bending | No | No | Yes | Yes |
| Tarnish | No | No | Yes | Yes |

INVENTION EXAMPLE 2

Herein below, a detailed description will be provided with regard to an second embodiment of the lead frame according to the present invention, which may be made from Ni, a Ni alloy, Cu, a Cu alloy, Fe or an Fe alloy. The substrate of the lead frame for semiconductor devices is made of Cu or a Cu alloy including a low tin phosphorous-bronze and Alloy 194, or an Fe—Ni alloy comprising 42 wt % (which is called "42 material"). In this example 2, the substrate was made from Alloy 194.

A thin plate of Alloy 194 may be formed to a lead frame optionally by the etching or the press method.

In this example 1, the lead frame is made as follows:
a. a thin plate of Alloy 194 is formed to a lead frame,
b. the lead frame is cleaned by washing,
c. the cleaned plate is optionally subjected to a heat treatment process to relieve residual stress therein which is produced when the thin plate is cut by the press work, and
d. the blank lead frame is subjected to the following plating process.

Plating Process
a. the blank lead frame was subjected to a cleaning process, a preliminary Cu-plating process and a local Ag-plating process like as above invention example 1,
b. the plated lead frame was subjected to a preliminary treatment at 30° C. for 15 seconds with utilization of an agent containing 50 g/l of sulfuric acid, and
c. outer lead parts 1 were plated with Sn—Ag by a local plating process at a current density of 60 A/dm$^2$, of which conditions were as follows,
   the plating solution contained 40 g/l of metal Sn as SnO, 1.5 g/l of metal Ag as Ag$_2$O, and 150 g/l of methane sulfonic acid,
   the additive agents was 3 g/l of 4,4-amino diphenyl sulfide, 5 g/l of naphthalene sulfonic acid monopoly ethylene glycol ether and 80 g/l of bisphenol A dipoly ethylene glycol ether,
   the plating was carried out by a jet flow method with utilization of a sparger under the conditions of a flow rate of 400 l/min. and 25° C. of plating temperature,
   while the anode electrode may be selected as stated in invention example 1, in this invention example 2, the unsoluble electrode was a Ti base with a coating of a mixture of iridium oxide and tantalum oxide, and the plating film was of a Sn—Ag alloy comprising 2.5 wt % Ag and had 8 μm of thickness.

After the Sn—Ag plating, the Cu underlayer in exposed surface areas, which had not been coated with the Ag plating and the Sn—Ag plating, was removed. Further, in order to remove unintentionally plated Ag layers on the sides of the lead, Ag on the lead frame surface was electrically removed.

Subsequently, the surface treatment layer 6 with a brightness of not less than 0.6, which comprises Ag and Sn, and which is formed on the outer lead part 1, was subjected to an etching process with utilization of a treatment agent including sodium triphosphate in order to improve soldering wettability under the following conditions, wherein Sn has the body-centered tetragonal lattice with the crystal orientation indices of from 1.5 to 5 at the (220) plane, not more than 0.9 at the (211) plane and not less than 0.5 at the (200) plane: a concentration of 120 g/l sodium triphosphate of the treatment liquid, 60° C. of the liquid temperature, and 30 seconds of the dipping duration time.

Finally, the lead frame was dipped in the anti-tarnish liquid followed by washing with water and subsequent drying.

The thus processed lead frame was examined by means of an X-ray diffractometer with regard to the crystal orientation of the Sn—Ag plating layer. As a result, it was confirmed that the Sn—Ag plating layer had a brightness of 0.74 and comprised Sn having the body-centered tetragonal lattice with the crystal orientation indices of from 1.69 at the (220) plane, 0 (zero) at the (211) plane and 0.89 at the (200) plane.

Soldering wettability was examined by the same conditions as those stated in invention example 1. A bending test was also carried out in order to observe exfoliation of the plating film, in which the outer lead part 1 was bent by an angle of 90°. The results were satisfactory as shown in Table 1 with regard to the zero cross times at initial and after holding at 175° C. for 24 hours, and an appearance.

Comparative Example 1

Herein below, a detailed description will be provided with regard to a comparative example of the lead frame of which substrate was made from "42 material". The lead-frame was produced as follows:

a. a thin plate of "42 material" is formed to a lead frame,
b. the lead frame is cleaned by washing,
c. the cleaned plate is optionally subjected to a heat treatment process to relieve residual stress therein which is produced when the thin plate is cut by the press work, and
d. the blank lead frame is subjected to the following plating process.

Plating Process a. the blank lead frame was subjected to a cleaning process, a preliminary Cu-plating process and a local Ag-plating process like as above invention example 1, and
b. without a preliminary treatment, outer lead parts 1 of the plated lead frame were plated with Sn—Ag by a local plating process at a current density of 20 A/dm², of which conditions were as follows,
   a D.C. power supply,
   the plating solution contained 40 g/l of metal Sn as SnO, 1.5 g/l of metal Ag as Ag₂O, and 150 g/l of methane sulfonic acid,
   the additive agents was 5 g/l of 4,4-amino diphenyl sulfide, 5 g/l of naphthalene sulfonic acid monopoly ethylene glycol ether and 80 g/l of bisphenol A dipoly ethylene glycol ether,
the anode electrode was an unsoluble one whose base was made of Ti and coated with a mixture of iridium oxide and tantalum oxide, and
the plating film was of a Sn—Ag alloy comprising 2.5 wt % Ag and had 8 μm of thickness.

After the Sn—Ag plating, the Cu underlayer in exposed surface areas, which had not been coated with the Ag plating and the Sn—Ag plating, was removed. Further, in order to remove unintentionally plated Ag layers on the sides of the lead, Ag on the lead frame surface was electrically removed.

Subsequently, the surface treatment layer 6 on the outer lead part 1 was subjected to an etching process with utilization of a treatment agent including sodium triphosphate in order to improve soldering wettability.

Finally, the lead frame was dipped in the anti-tarnish liquid followed by washing with water and subsequent drying.

The thus processed lead frame was examined by means of an X-ray diffractometer with regard to the crystal orientation of the Sn—Ag plating layer. As a result, it was confirmed that the Sn—Ag plating layer had a brightness of 0.45 and comprised Sn having the body-centered tetragonal lattice with the crystal orientation indices of from 6.38 at the (220) plane, 0.12 at the (211) plane and 0.11 at the (200) plane.

Soldering wettability was examined by the same conditions as those stated in invention example 1. A bending test was also carried out in order to observe exfoliation of the plating film, in which the outer lead part 1 was bent by an angle of 900°. The results were bad as shown in Table 1 with regard to the zero cross times at initial and after holding at 175° C. for 24 hours, and an appearance. Further, cracks occurred in the bending test.

Comparative Example 2

In this example 2, the substrate of the lead frame was made from "Alloy 194". The lead frame was produced as follows:

a. a thin plate of "Alloy 194" is formed to a lead frame,
b. the lead frame is cleaned by washing,
c. the cleaned plate is optionally subjected to a heat treatment process to relieve residual stress therein which is produced when the thin plate is cut by the press work, and
d. the blank lead frame is subjected to the following plating process.

Plating Process a. the blank lead frame was subjected to a cleaning process, a preliminary Cu-plating process and a local Ag-plating process like as above invention example 1,
b. the lead frame was subjected to a preliminary treating with utilization of a treatment agent containing nitric acid, and
c. outer lead parts of the plated lead frame were plated with Sn—Ag by a local plating process at a current density of 20 A/dm², of which conditions were as follows,
   a D.C. power supply,
   the plating solution contained 40 g/l of metal Sn as SnO, 1.5 g/l of metal Ag as Ag₂O, and 150 g/l of methane sulfonic acid,
   the additive agents was 6 g/l of 4,4-amino diphenyl sulfide, 5 g/l of naphthalene sulfonic acid monopoly ethylene glycol ether and 80 g/l of bisphenol A dipoly ethylene glycol ether, the anode electrode was an unsoluble one whose base was made of Ti and coated with a mixture of iridium oxide and tantalum oxide, and the plating film was of a Sn—Ag alloy comprising 2.5 wt % Ag and had 8 μm of thickness.

After the Sn—Ag plating, the Cu underlayer in exposed surface areas, which had not been coated with the Ag plating and the Sn—Ag plating, was removed. Further, in order to remove unintentionally plated Ag layers on the sides of the lead, Ag on the lead frame surface was electrically removed.

Subsequently, without etching for improving soldering wettability, the lead frame was dipped in the anti-tarnish liquid followed by washing with water and subsequent drying.

The thus processed lead frame was examined by means of an X-ray diffractometer with regard to the crystal orientation of the Sn—Ag plating layer. As a result, it was confirmed that the Sn—Ag plating layer had a brightness of 0.5 and comprised Sn having the body-centered tetragonal lattice with the crystal orientation indices of from 6.07 at the (220) plane, not more than 0.6 at the (211) plane and 0.27 at the (200) plane.

Soldering wettability was examined by the same conditions as those stated in invention example 1. A bending test was also carried out in order to observe exfoliation of the plating film, in which the outer lead part 1 was bent by an angle of 90°. The results were bad as shown in Table 1 with regard to the zero cross times at initial and after holding at 175° C. for 24 hours, and an appearance. Further, cracks occurred in the bending test.

INVENTION EXAMPLE 3

Figure 5A:
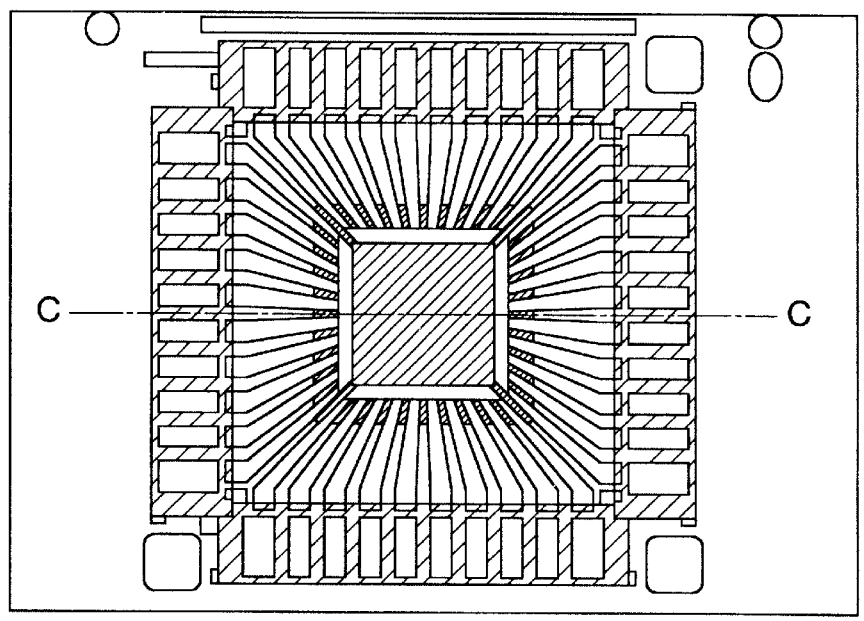
FIG. 5A is a sectional view of another embodiment of the lead frame according to the invention.
Figure 5B:
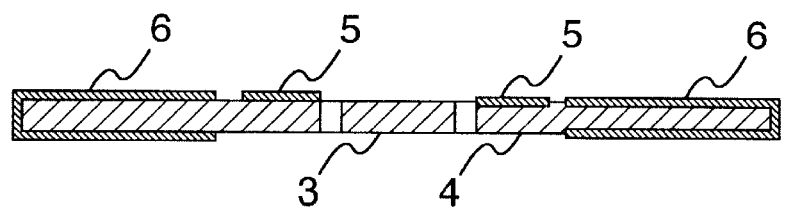
FIG. 5B is a sectional view of the lead frame taken along line C—C in FIG. 5A.
Figure 5C:
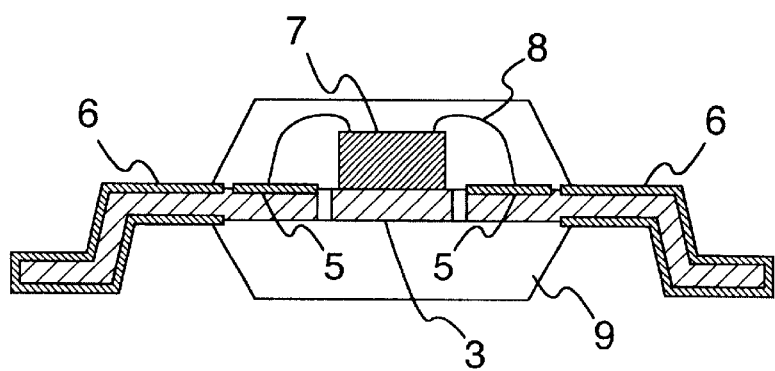
FIG. 5C is a sectional view of the lead frame with an IC package after molding, which corresponds to that of FIG. 5B.

Herein, a description will be provided on invention example 3 with reference to FIGS. 5A–5C.

The following is a fabrication process according to invention example 3:

1. A die-attach resin was applied to a lead frame as shown in FIGS. 1 and 2, and an IC chip 7 was mounted thereon,
2. the lead frame was held at 200° C. for 2 hours in an oven to dry the resin and fix the chip,
3. the lead frame and the IC chip 7 were electrically connected by wire-bonding, and
4. the IC chip was hermetically sealed with a molding resin 9.

After hermetic sealing, conventionally, an oxide film on the lead frame has been removed and subsequently outer lead parts have been provided with a post-plating of solder. However, according to the lead frame of the present invention, the fabrication process is simplified since such removing process is not needed.

INVENTION EXAMPLE 4

Herein, a description will be provided on invention example 4 with reference to FIGS. 5A–5C.

The following is a fabrication process according to invention example 4:

1. A die-attach resin was applied to a lead frame being plated only with Ag, and an IC chip 7 was mounted thereon,
2. the lead frame was held at 200° C. for 2 hours in an oven to dry the resin and fix the chip,
3. the lead frame and the IC chip 7 were electrically connected with bonding wires 8,
4. the IC chip 7 was hermetically sealed with a molding resin 9.

5. after hermetic sealing, an oxide film on the lead frame was removed,
6. outer lead parts 1 were provided with Sn—Ag post-plating under the plating conditions of a plating solution containing SnO, $Ag_2O$ and methane-sulfonic acid, a current density of 60 $A/dm^2$, a plating film thickness of 8 μm,
7. a surface treatment layer 6 on the outer lead parts 1 was treated with a treatment agent including sodium triphosphate in order to improve soldering wettability, and
8. the lead frame was washed with water and dried.

The thus processed lead frame was examined by means of an X-ray diffractometer with regard to the crystal orientation of the Sn—Ag plating layer. As a result, it was confirmed that the Sn—Ag plating layer had a brightness of 0.6 and the body-centered tetragonal lattice with the crystal orientation indices within a range of from 1.5 to 5 at the (220) plane, not more than 0.9 at the (211) plane and not less than 0.5 at the (200) plane.

What is claimed is:

1. A semiconductor device comprising a lead frame which is made from Ni, a Ni alloy, Cu, a Cu alloy, Fe or an Fe alloy, wherein:

the lead frame comprises an inner lead part with a surface treatment layer of Ag or a Ag-containing alloy and an outer lead part with a surface treatment layer of an alloy containing Ag and Sn, wherein the surface treatment layer on said outer lead part has a brightness of not less than 0.6 and Sn has a body-centered tetragonal lattice with crystal orientation indices of from 1.5 to 5 at a (220) plane, not more than 0.9 at a (211) plane and not less than 0.5 at a (200) plane.

2. A semiconductor device according to claim 1, wherein the surface treatment layer on the outer lead part has a thickness of 3 to 15 μm.

3. A semiconductor device according to claim 1, wherein the surface treatment layer on the outer lead part comprises 1 to 8 wt % Ag.

4. A semiconductor device according to claim 1, wherein the surface treatment layer on the outer lead part is plated with utilization of a non-soluble electrode which contains one or more of metal Pt, Ir, Ta, Rh, Ru and oxides thereof.

5. A semiconductor device comprising a lead frame, wherein:

the lead frame comprises an outer lead part with a surface treatment layer of an alloy containing Ag and Sn, wherein the surface treatment layer has a brightness of not less than 0.6 and Sn has a body-centered tetragonal lattice with crystal orientation indices of from 1.5 to 5 at a (220) plane, not more than 0.9 at a (211) plane and not less than 0.5 at a (200) plane.

6. A semiconductor device according to claim 5, wherein the surface treatment layer has a thickness of 3 to 15 μm.

7. A semiconductor device according to claim 5, wherein the surface treatment layer comprises 1 to 8 wt % Ag.

8. A method of producing a semiconductor device comprising a lead frame which is made from Ni, a Ni alloy, Cu, a Cu alloy, Fe or an Fe alloy, and which comprises an inner lead part with a surface treatment layer of Ag or a Ag-containing alloy and an outer lead part with a surface treatment layer of an alloy containing Ag and Sn, wherein the surface treatment layer on said outer lead part has a brightness of not less than 0.6 and Sn has a body-centered tetragonal lattice with crystal orientation indices of from 1.5 to 5 at a (220) plane, not more than 0.9 at a (211) plane and not less than 0.5 at a (200) plane, wherein:

the surface treatment layer on the outer lead part is plated with utilization of a plating solution which contains one or more selected from alkane sulfonic acid, alkanol sulfonic acid and sulfamine acid as an acid component, one or more of tin methane-sulfonate and SnO as a tin salt, and one or more selected from silver methane-sulfonate, $Ag_2O$ and AgO as a silver salt.

9. A method of producing a semiconductor device according to claim 8, wherein the outer lead part is subjected to a preliminary etching treatment with utilization of a treatment agent of one or more selected from chloric acid, nitric acid and sulfic acid prior to forming the surface treatment layer on said outer lead part.

10. A method of producing a semiconductor device according to claim 8, wherein the surface treatment layer on the outer lead part is treated by a treating agent containing sodium triphosphate.

11. A method of producing a semiconductor device comprising a lead frame which comprises an outer lead part with a surface treatment layer of an alloy containing Ag and Sn, in which the surface treatment layer has a brightness of not less than 0.6 and Sn has a body-centered tetragonal lattice with crystal orientation indices of from 1.5 to 5 at a (220) plane, not more than 0.9 at a (211) plane and not less than 0.5 at a (200) plane, wherein:

the surface treatment layer on the outer lead part is plated with utilization of a plating solution which contains organic sulfonic acid, an organic sulfonate or a metal oxide as a metal salt.

12. A method of producing a semiconductor device according to claim 11, wherein the outer lead part is subjected to a preliminary etching treatment with utilization of a treatment agent of one or more selected from chloric acid, nitric acid and sulfic acid prior to forming the surface treatment layer.

13. A method of producing a semiconductor device according to claim 12, wherein the surface treatment layer on the outer lead part is treated by a treating agent containing sodium triphosphate.

* * * * *